(12) United States Patent
Li et al.

(10) Patent No.: US 9,520,639 B2
(45) Date of Patent: Dec. 13, 2016

(54) TP ON/IN CELL-TYPE ORGANIC ELECTROLUMINESCENT DISPLAY DEVICE HAVING INTEGRATED NFC ANTENNA

(71) Applicant: TRULY SEMICONDUCTORS LTD., Shanwei, Guangdong (CN)

(72) Inventors: Jianhua Li, Guangdong (CN); Xuebin Chen, Guangdong (CN)

(73) Assignee: TRULY SEMICONDUCTORS LTD., Shanwei, Guangdong (CN)

( * ) Notice: Subject to any disclaimer, the term of this patent is extended or adjusted under 35 U.S.C. 154(b) by 110 days.

(21) Appl. No.: 14/384,662

(22) PCT Filed: Feb. 6, 2013

(86) PCT No.: PCT/CN2013/071442
§ 371 (c)(1),
(2) Date: Sep. 11, 2014

(87) PCT Pub. No.: WO2013/149518
PCT Pub. Date: Oct. 10, 2013

(65) Prior Publication Data
US 2015/0041786 A1    Feb. 12, 2015

(30) Foreign Application Priority Data

Apr. 6, 2012    (CN) .......................... 2012 2 0145136
Jul. 5, 2012     (CN) .......................... 2012 1 0232611

(51) Int. Cl.
*H01Q 1/44*    (2006.01)
*H01Q 1/22*    (2006.01)
(Continued)

(52) U.S. Cl.
CPC .......... *H01Q 1/2283* (2013.01); *G02F 1/1368* (2013.01); *G02F 1/13306* (2013.01);
(Continued)

(58) Field of Classification Search
CPC ...... H01Q 1/44; H01Q 1/2266; H01Q 1/2283; H01Q 1/2258; H01Q 1/22; H01Q 1/40; H04B 5/0081; G02F 1/133345; G02F 1/13338; G02F 1/133512; G02F 1/133514; G02F 1/1368; G02F 1/13306; G02F 1/167; H05K 1/181; H05K 1/189; H05K 2201/10098; H05K 2201/01; G09G 3/344; G09G 2370/00
See application file for complete search history.

(56) References Cited

U.S. PATENT DOCUMENTS

2009/0137204 A1 *  5/2009   Chang ..................... H04B 5/00
                                                         455/41.1
2011/0053556 A1    3/2011   Masaryk et al.
(Continued)

FOREIGN PATENT DOCUMENTS

CN    201215827 Y    4/2009
CN    202068693 U    12/2011
(Continued)

*Primary Examiner* — Charles Hicks
(74) *Attorney, Agent, or Firm* — Knobbe Martens Olson & Bear LLP

(57) ABSTRACT

An organic light-emitting diode displayer integrated with a near field communication antenna is provided. The organic light-emitting diode displayer is a TP on-cell or in-cell organic light-emitting diode displayer, the near field communication antenna is disposed on a display screen of the organic light-emitting diode displayer, and a near field communication interface is built on an output circuit of the display screen and is connected to a control mainboard of the display screen.

16 Claims, 3 Drawing Sheets

(51) Int. Cl.

| | | |
|---|---|---|
| *H04B 5/00* | (2006.01) | |
| *G02F 1/335* | (2006.01) | |
| *H01Q 7/00* | (2006.01) | |
| *H01Q 1/40* | (2006.01) | |
| *H01Q 1/50* | (2006.01) | |
| *H05B 33/08* | (2006.01) | |
| *H01L 27/32* | (2006.01) | |
| *G02F 1/1333* | (2006.01) | |
| *G02F 1/1335* | (2006.01) | |
| *G02F 1/1368* | (2006.01) | |
| *H05K 1/18* | (2006.01) | |
| *G02F 1/133* | (2006.01) | |
| *G02F 1/167* | (2006.01) | |
| *G09G 3/34* | (2006.01) | |
| *H01L 27/12* | (2006.01) | |

(52) U.S. Cl.
CPC .... *G02F 1/13338* (2013.01); *G02F 1/133345* (2013.01); *G02F 1/133512* (2013.01); *G02F 1/133514* (2013.01); *G02F 1/167* (2013.01); *G09G 3/344* (2013.01); *H01L 27/124* (2013.01); *H01L 27/323* (2013.01); *H01L 27/3225* (2013.01); *H01Q 1/22* (2013.01); *H01Q 1/2258* (2013.01); *H01Q 1/2266* (2013.01); *H01Q 1/40* (2013.01); *H01Q 1/44* (2013.01); *H01Q 1/50* (2013.01); *H01Q 7/00* (2013.01); *H04B 5/0081* (2013.01); *H05B 33/0896* (2013.01); *H05K 1/181* (2013.01); *H05K 1/189* (2013.01); *G09G 2370/00* (2013.01); *H05K 2201/10098* (2013.01); *H05K 2201/10151* (2013.01)

(56) References Cited

U.S. PATENT DOCUMENTS

| | | | | |
|---|---|---|---|---|
| 2012/0206302 | A1* | 8/2012 | Ramachandran | H01Q 1/24 343/702 |
| 2013/0059532 | A1* | 3/2013 | Mahanfar | H04B 5/0031 455/41.1 |

FOREIGN PATENT DOCUMENTS

| | | |
|---|---|---|
| CN | 102479995 A | 5/2012 |
| CN | 102737582 A | 10/2012 |
| JP | 2010102531 A | 5/2010 |
| WO | 2009/014366 A2 | 1/2009 |

* cited by examiner

TP ON/IN CELL-TYPE ORGANIC ELECTROLUMINESCENT DISPLAY DEVICE HAVING INTEGRATED NFC ANTENNA

The present application is the national phase of International Application No. PCT/CN2013/071442, titled "TP ON/IN CELL-TYPE ORGANIC ELECTROLUMINESCENT DISPLAY DEVICE HAVING INTEGRATED NFC ANTENNA", filed on Feb. 6, 2013, which claims the priority to Chinese Patent Application 201220145136.8, entitled "DISPLAY SCREEN", filed on Apr. 6, 2012 with the State Intellectual Property Office of People's Republic of China, and claims the priority to Chinese Patent Application 201210232611.X, entitled "TP ON/IN CELL ORGANIC LIGHT-EMITTING DIODE DISPLAYER INTEGRATED WITH NFC ANTENNA", filed on Jul. 5, 2012 with the State Intellectual Property Office of People's Republic of China, which are incorporated herein by reference in entirety.

FIELD OF TECHNOLOGY

The present disclosure relates to the technical field of near field communication, in particular to an organic light-emitting diode (OLED) displayer integrated with a near field communication (NFC) antenna, and particularly to a touch panel (TP) on/in cell organic light-emitting diode displayer.

BACKGROUND

Near Field Communication (NFC) technology is a necessary technology for electrical products in the future and has a large market. In existing NFC products, the antenna is generally disposed on one side of a battery or adhered in a shell, in a common way of forming a coil with metal wiring on a Printed Circuit Board (PCB) or a Flexible Printed Circuit (FPC) and then adhering the PCB or the FPC, which has the coil, to the battery or the shell. Disadvantage of the existing NFC products mainly is that: with frequent disassembly and assembly of the battery and the shell, wiring of the NFC antenna is prone to wear off or to have a problem of inaccurate alignment, which eventually causes deterioration of antenna signal and affects the function of the NFC products. In addition, the antenna of the NFC product is normally located inside the shell of the electrical product, and in a case of metal shell, signal transmission of the NFC signal may be affected; therefore the choice of strong metal for the shell of the electrical product is limited.

For example, lots of electrical products equipped with a NFC antenna and an organic light-emitting diode (OLED) displayer have above problems. The so-called OLED is a kind of emerging flat-panel displayer which has advantages of active luminescence, high contrast, fast response, and thin and light design, and is known as a new generation of displayer that may displace liquid crystal displayer (LCD). The principle of light emitting in the OLED is that functional layers including a charge injection layer, a charge transfer layer and a luminous layer are disposed between an anode and a cathode, and the OLED may emit light through applying a proper voltage between the electrodes. At present, an organic light-emitting diode displayer having a touch function mainly includes "In-cell" and "On-cell" structures. In the "On-cell" structure which is becoming popular, a touch sensing layer is separated from an integrated circuit (IC) layer integrated with a second electrode; in the "In-cell" structure, the touch sensing layer is integrated with the IC layer integrated with the second electrode.

In the unreasonable way of disposing a NFC antenna for an electrical product, which is equipped with the NFC antenna and an organic light-emitting diode displayer, wiring of the NFC antenna is prone to wear off or to have an inaccurate alignment, which may cause deterioration of signal quality and may limit the choice for a shell of the electrical product. Since the integration of the NFC antenna is allowable in the process of producing the organic light-emitting diode displayer, it is desirable to design a new organic light-emitting diode displayer integrated with a NFC antenna to solve above problems.

SUMMARY

In view of this, the disclosure is to provide an organic light-emitting diode displayer integrated with a NFC antenna, which may prevent wiring of the antenna from wearing off or inaccurate alignment and is beneficial to ensure quality of antenna signal. In addition, for an electrical product equipped with the organic light-emitting diode displayer, signal is transferred through a facade of the displayer, and the material of a shell is not limited due to the NFC antenna.

To solve above technical problems, a technical solution is provided in the disclosure as follows. An organic light-emitting diode displayer integrated with a NFC antenna is a TP on-cell or in-cell organic light-emitting diode displayer, the NFC antenna is disposed on a display screen of the organic light-emitting diode displayer, and a NFC interface is built on an output circuit of the display screen and is connected to a control mainboard of the display screen.

Preferably, the organic light-emitting diode displayer is a TP on cell organic light-emitting diode displayer, a display screen of the TP on cell organic light-emitting diode displayer includes a protective element, a touch sensing layer, a first electrode, an organic luminous functional layer, an integrated circuit layer integrated with a second electrode, and a substrate sequentially, where an output wire is led out from the second electrode, the NFC antenna is led to the output circuit of the display screen for the organic light-emitting diode displayer through conductive material.

Preferably, the NFC antenna is disposed on an inner surface of the protective element and is located in a light blocking area at circumference of the touch sensing layer.

Preferably, the NFC antenna is disposed at circumference of an outer surface of the protective element and covers an insulation protection film.

Preferably, the NFC antenna is disposed on the touch sensing layer located at inner side of the protective element and is located in a light blocking area at circumference of the touch sensing layer, with an insulation protection layer provided to insulate the near field communication antenna from the touch sensing layer at desirable insulation places.

Preferably, the organic light-emitting diode displayer is a TP on cell organic light-emitting diode displayer, a display screen of the TP on cell organic light-emitting diode displayer includes a protective element, a first electrode, an organic luminous function layer, an integrated circuit layer integrated with a second electrode, a touch sensing layer and a substrate sequentially, where an output wire is led out from the second electrode, the NFC antenna is led to the output circuit of the display screen for the organic light-emitting diode displayer through conductive material.

Preferably, the NFC antenna is disposed on an inner surface of the substrate and is located in a light blocking area at circumference of the touch sensing layer.

Preferably, the organic light-emitting diode displayer is a TP in cell organic light-emitting diode displayer, a display screen of the TP in cell organic light-emitting diode displayer includes a protective element, a first electrode, an organic luminous function layer, an integrated circuit layer in which a touch sensing layer and a second electrode are integrated, and a substrate sequentially, where an output wire is led out from the second electrode, the NFC antenna is led to the output circuit of the display screen for the organic light-emitting diode displayer through conductive material.

Preferably, the NFC antenna is disposed between the substrate and the integrated circuit layer in which the touch sensing layer and the second electrode are integrated, or the NFC antenna is disposed at circumference of an outer surface of the substrate and covers an insulation protection film.

Preferably, the organic light-emitting diode displayer is a TP in cell organic light-emitting diode displayer, a display screen of the TP in cell organic light-emitting diode displayer includes a protective element, a touch sensing layer, a first electrode, an organic luminous function layer, a second electrode and a substrate sequentially, where an output wire is led out from the second electrode, the NFC antenna is led to the output circuit of the display screen for the organic light-emitting diode displayer through conductive material.

Preferably, the NFC antenna is in a form of a multi-turn coil made from conductive material wiring, the multi-turn coil is led to the output circuit of the display screen for the organic light-emitting diode displayer by conductive material.

Preferably, the NFC antenna is made from low-resistance wiring such as silver, copper or aluminum.

Preferably, the multi-turn coil is wound in an annular shape matching with a product outer contour.

Preferably, the multi-turn coil is wound in a rectangle or circle shape.

Preferably, a side of the multi-turn coil, which is closer to inner part of the organic light-emitting diode displayer, is covered by a layer of transparent ferrite material.

Compared to conventional technology, in an organic light-emitting diode displayer integrated with a NFC antenna according to the disclosure, the NFC antenna is directly disposed on the organic light-emitting diode displayer. The NFC interface is built on an output circuit of the display screen and is connected to a control mainboard, therefore the NFC interface is fixed after assembly and is not frequently assembled and disassembled, and signal quality deterioration and reception failure due to wearing off and inaccurate alignment of the NFC antenna interface are avoided. In addition, a solution is provided for facilitating reception of NFC signal from a display plane of the displayer or for application to the case that the NFC signal must be received from the display plane of the displayer. In addition, for an electrical product equipped with the organic light-emitting diode displayer, signal is transferred through facade of the displayer, and the material of a shell is not limited due to the NFC antenna.

BRIEF DESCRIPTION OF THE DRAWINGS

In FIGS. 1a~5:

1. protective element; 2. touch sensing layer; 3. first electrode; 4. organic luminous functional layer; 5. second electrode; 6. substrate; 7. sealing material; 8. NFC antenna; 9. output wiring; 10. insulation protection film.

DETAILED DESCRIPTION OF THE EMBODIMENTS

The basic idea of the disclosure is that a NFC antenna is disposed on a display screen of an organic light-emitting diode displayer, of which a NFC interface is built on an output circuit of the display screen and is connected to a control mainboard of the display screen.

For better understanding of the technical solutions of the present disclosure by those skilled in the art, the technical solutions according to embodiments of the disclosure are described clearly and completely in the following in conjunction with the appended drawings.

Figure 1A:
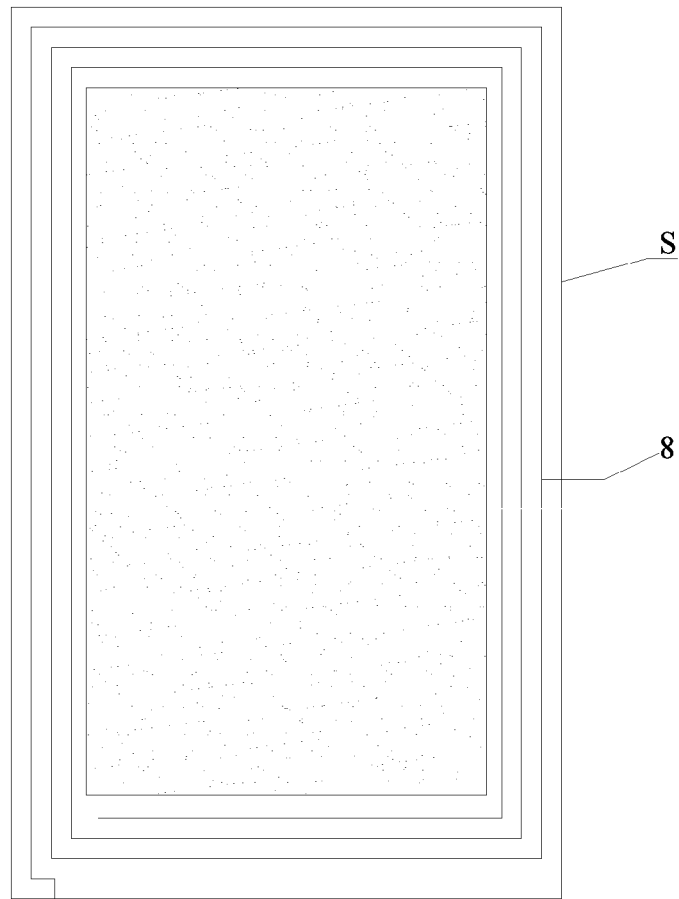
FIG. 1a is a front view showing assembling position for a NFC antenna on a display screen in an organic light-emitting diode displayer integrated with the NFC antenna according to embodiment 1 of the disclosure.
Figure 1B:
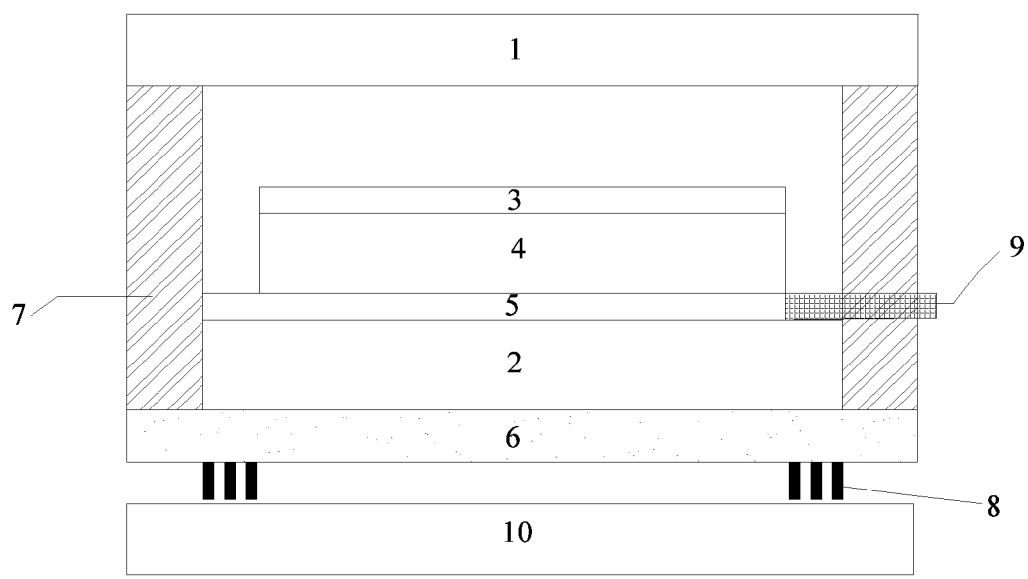
FIG. 1b is a schematic diagram showing assembling structure for the NFC antenna in the organic light-emitting diode displayer integrated with the NFC antenna according to embodiment 1 of the disclosure.

In the following embodiments, FIG. 1a and FIG. 1b represent Touch Panel (TP) in cell organic light-emitting diode displayers, in which a touch sensing layer 2 and a second electrode 5 are integrated together; FIG.2~FIG.5 represent TP on cell organic light-emitting diode displayers, in which a touch sensing layer 2 and a second electrode 5 are separated; the embodiments are described respectively as follows.

Embodiment 1

FIG. 1a and FIG. 1b represent an assembling structure of a NFC antenna in an organic light-emitting diode displayer integrated with the NFC antenna according to embodiment 1 of the disclosure. The organic light-emitting diode displayer integrated with a NFC antenna is a TP in cell organic light-emitting diode displayer, of which a display screen S includes a protective element 1 (either a combination of a rear cover and desiccant, or the film encapsulation), a first electrode 3 (normally a transparent cathode), an organic luminous functional layer 4 (including an injection layer, luminous material, a hole injection layer, etc.), a second electrode 5 (normally a transparent anode), a touch sensing layer 2 (TP Sensor) and a transparent substrate 6. The touch sensing layer 2 and the second electrode 5 are integrated in an integrated circuit layer. The substrate is normally made of glass; the second electrode 5 is normally an ITO transparent conductive film which leads out an output wiring 9; the first electrode 3 is normally made of Al, Ag, Mg or alloy; the protective element 1 normally includes a rear cover of glass;

sealant glue 7 or other sealing material between the protective element 1 and the substrate 6 normally is UV glue; specifically, connection is that the substrate 6 and the rear cover of the protective element 1 are encapsulated through sealant glue 7, with the first electrode 3 and the second electrode 5 being disposed in the inner chamber and the organic luminous functional layer 4 being disposed between the two electrodes.

Specific placement of the NFC antenna 8 is shown in FIG. 1*b*. The NFC antenna 8 is disposed between the substrate 6 and an integrated circuit layer in which the touch sensing layer and the second electrode are integrated, or the NFC antenna is disposed on a light blocking area at circumference of an inner surface of the substrate (specifically located in the light blocking area at circumference of the touch sensing layer) and covers the insulation protection film 10. The NFC antenna 8 is led to the output circuit of the display screen for the organic light-emitting diode displayer through conductive material.

Specifically, an ink layer or other light blocking layer is printed at circumference of an outer surface of the substrate 6; the NFC antenna 8 is in a form of a multi-turn coil made from metal (silver, copper, aluminum) wiring or other low-resistance wiring (such as carbon), and the multi-turn coil is led to the output circuit of the display screen for the organic light-emitting diode displayer through conductive material. The multi-turn coil is wound in a rectangle or circle shape or other annular shape matching with outer contour of the displayer product; a side of the multi-turn coil, which is closer to inner part of the organic light-emitting diode displayer, is covered by a layer of transparent ferrite material to enhance magnetic field induction intensity. Such wiring may be implemented by using existing equipment, and will not incur new investment.

In addition, an antenna matching circuit (not shown) is provided for the NFC antenna 8. The antenna matching circuit includes a charge-discharge module and an impedance module connected to the charge-discharge module, where the charge-discharge module includes capacitors connected in series or in parallel, and the impedance module is includes resistors connected in series or in parallel. Therefore, power matching of the NFC antenna 8 is implemented through the antenna matching circuit.

Embodiment 2

Figure 2:
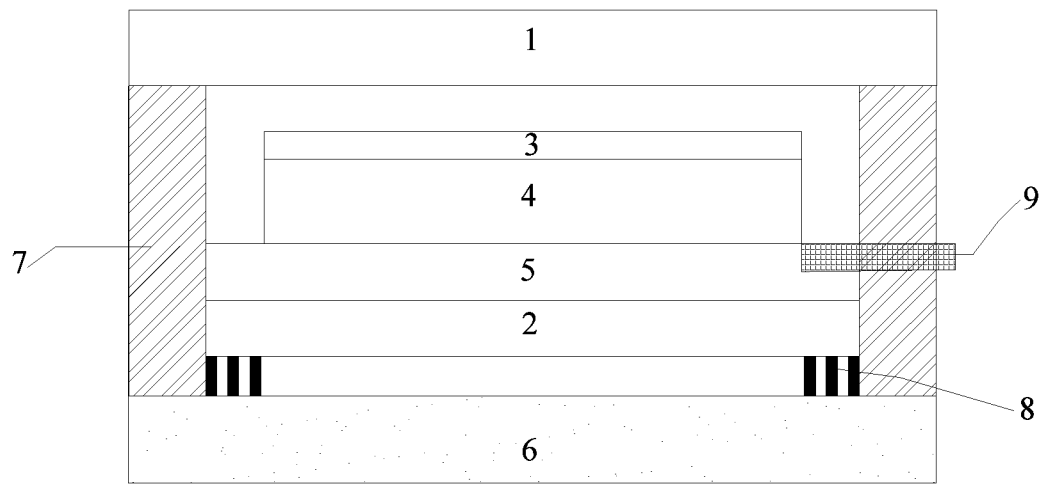
FIG. 2 is a schematic diagram showing assembling structure for a NFC antenna in an organic light-emitting diode displayer integrated with the NFC antenna according to embodiment 2 of the disclosure.

FIG. 2 represents an assembling structure of a NFC antenna in an organic light-emitting diode displayer integrated with the NFC antenna according to embodiment 2 of the disclosure. Different from embodiment 2, the organic light-emitting diode displayer integrated with a NFC antenna in this embodiment is a TP on cell organic light-emitting diode displayer, of which a touch sensing layer 2 is separated from an integrated circuit layer integrated with a second electrode 5. A display screen of the TP on cell organic light-emitting diode displayer includes a protective element 1, a first electrode 3, an organic luminous function layer 4, an integrated circuit layer integrated with a second electrode 5, an insulating layer (not shown), a touch sensing layer 2 and a substrate 6 sequentially, where an output wire is led out from the second electrode, the NFC antenna is led to an output circuit of the display screen for the organic light-emitting diode displayer through conductive material.

Difference of disposed position for the NFC antenna 8 lies in that the NFC antenna 8 is disposed at circumference of an inner surface of the substrate 6, and the NFC antenna 8 is led to the output circuit of the display screen for the organic light-emitting diode displayer through conductive material; other structures are the same as the those according to embodiment 1 and are not described.

Embodiment 3

Figure 3:
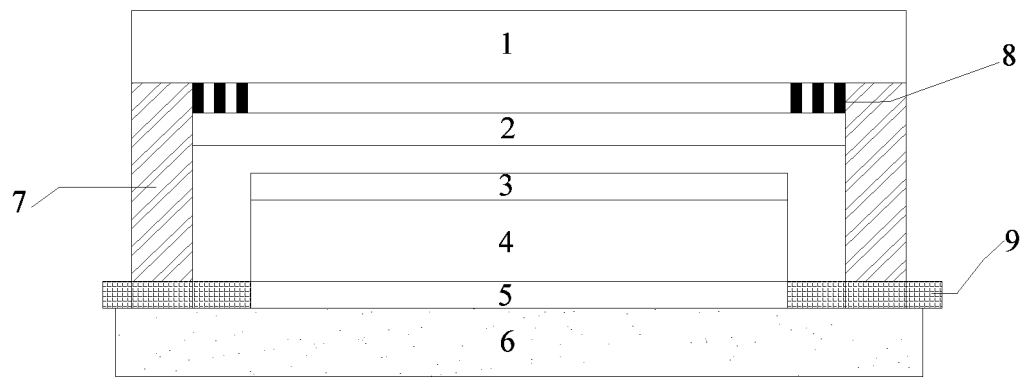
FIG. 3 is a schematic diagram of assembling structure for a NFC antenna in an organic light-emitting diode displayer integrated with the NFC antenna according to embodiment 3 of the disclosure.

FIG. 3 represents an assembling structure of a NFC antenna in an organic light-emitting diode displayer integrated with the NFC antenna according to embodiment 3 of the disclosure. The organic light-emitting diode displayer integrated with a NFC antenna is a TP on cell organic light-emitting diode displayer, of which a touch sensing layer is separated from an integrated circuit layer integrated with a second electrode. A display screen of the TP on cell organic light-emitting diode displayer includes a protective element 1, a touch sensing layer 2, a first electrode 3, an organic functional layer 4, an integrated circuit layer integrated with a second electrode 5, and a substrate 6 sequentially, where an output wire is led out from the second electrode 5, and the NFC antenna is led to the output circuit of the display screen for the organic light-emitting diode displayer through conductive material.

The protective element 1 may be in a structure of a combination of a transparent rear cover and desiccant; the touch sensing layer 2 is located between the protective element 1 and the first electrode 3; the NFC antenna 8 is disposed on the inner surface of the protective element 1 and is located in a light blocking area at circumference of the touch sensing layer 2, and the NFC antenna 8 is led to an output circuit of the display screen for the organic light-emitting diode displayer through conductive material. Specifically, an ink layer or other light blocking layer is printed at circumference of the inner surface of the protective element 1; the NFC antenna 8 is in a form of a multi-turn coil made from metal (silver, copper, aluminum) wiring or other low-resistance wiring (such as carbon), and the multi-turn coil is led to the output circuit of the display screen for the organic light-emitting diode displayer through conductive material.

The NFC antenna according to the embodiment is disposed on the protective element 1 without desiccant and an insulating layer, and other structures are the same as those according to embodiment 1 and embodiment 2 and are not described.

Embodiment 4

Figure 4:
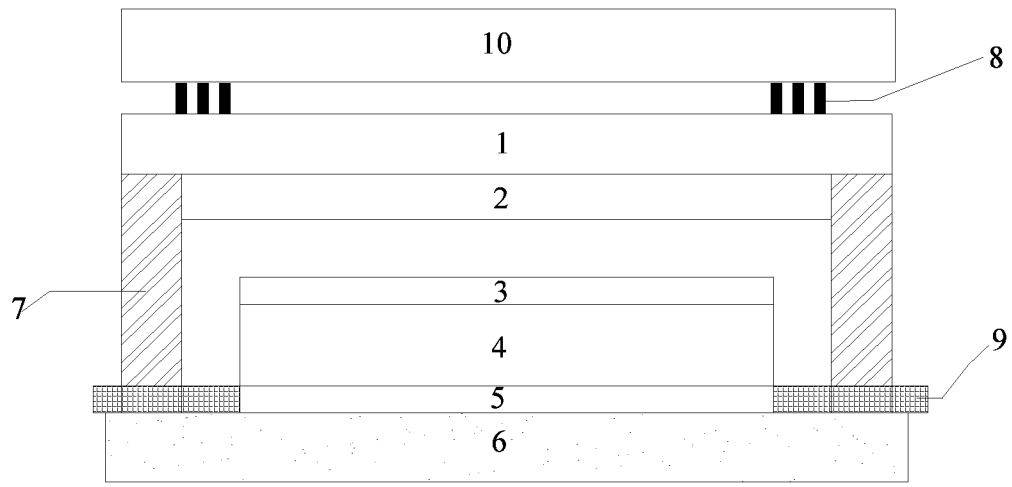
FIG. 4 is a schematic diagram of assembling structure for a NFC antenna in an organic light-emitting diode displayer integrated with the NFC antenna according to embodiment 7 of the disclosure.

FIG. 4 represents an assembling structure of a NFC antenna in an organic light-emitting diode displayer integrated with the NFC antenna according to embodiment 4 of the disclosure. The same as the embodiment 3, the organic light-emitting diode displayer integrated with a NFC antenna is a TP on cell organic light-emitting diode displayer, of which the touch sensing layer 2 is located between the protective element 1 and the first electrode 3, is a TP on cell organic light-emitting diode displayer as the one according to embodiment 3; the difference is that the NFC antenna 8 is disposed at circumference of the outer surface of the protective element 1 and covers an insulation protection film 10; the NFC antenna 8 is led to an output circuit of the display screen for the organic light-emitting diode displayer; other structures are the same as those according to embodiment 3 and are not described.

Embodiment 5

Figure 5:
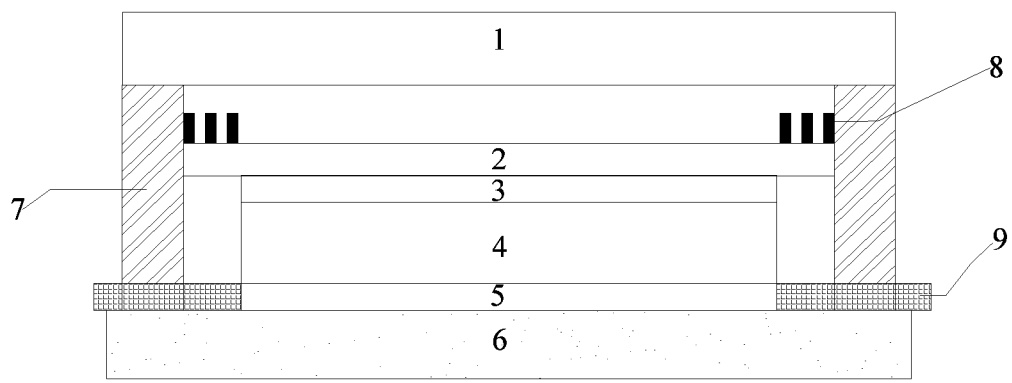
FIG. 5 is a schematic diagram of assembling structure for a NFC antenna in an organic light-emitting diode displayer integrated with the NFC antenna according to embodiment 5 of the disclosure.

FIG. 5 represents an assembling structure of a NFC antenna in an organic light-emitting diode displayer integrated with the NFC antenna according to embodiment 5 of the disclosure. The same as the embodiments 3 and 4, the organic light-emitting diode displayer integrated with a NFC antenna is a TP on cell organic light-emitting diode displayer, of which the touch sensing layer 2 is located between the protective element 1 and the first electrode 3; the difference is that the NFC antenna 8 is disposed on the touch sensing layer 2 located at inner side of the protective element 1 and is located in a light blocking area at circumference of the touch sensing layer 2, with an insulation protection layer provided to insulate the NFC antenna 8 from the touch sensing layer 2 at desirable insulation places. The NFC antenna 8 is led to the output circuit of the display screen for the organic light-emitting diode displayer through conductive material; other structures are the same as those according to embodiment 3 or embodiment 4 and are not described.

By the way, the protective element in the structure of the combination of the rear cover and desiccant may be replaced directly by using film encapsulation, which may protect the organic light-emitting diode displayer as well; the type of the protective element may be chosen as needed and is not described.

According to above embodiments, the NFC antenna 8 is directly disposed on the organic light-emitting diode displayer. The NFC interface is built on an output circuit of the display screen and is connected to a control mainboard (not shown), therefore the NFC interface is fixed after assembly and is not frequently assembled and disassembled, and signal quality deterioration and reception failure due to wearing off and inaccurate alignment of the NFC antenna interface are avoided. In addition, a solution is provided for facilitating reception of NFC signal from a display plane of the displayer or for application to the case that the NFC signal must be received from the display plane of the displayer. In addition, for an electrical product equipped with the organic light-emitting diode displayer, signal is transferred through facade of the displayer, and the material of a shell is not limited due to the NFC antenna.

The organic light-emitting diode displayer integrated with a NFC antenna according to the disclosure, for which functions of a display screen and a NFC antenna are combined, is more competitive in the market.

Preferred embodiments of the disclosure are set forth above. It should be noted that the preferred embodiments should not be seen as a limitation to the disclosure, and scope of the disclosure should be subjected to the appended claims. Some modifications and improvements may be made by those skilled in the art within the spirit and scope of the disclosure and these modifications and improvements fall in the scope of the disclosure.

The invention claimed is:

1. An organic light-emitting diode displayer integrated with a near field communication antenna, wherein the organic light-emitting diode displayer is a touch panel TP on-cell or in-cell organic light-emitting diode displayer, the near field communication antenna is disposed on a display screen of the organic light-emitting diode displayer, and a near field communication interface is built on an output circuit of the display screen and is connected to a control mainboard of the display screen.

2. The organic light-emitting diode displayer integrated with a near field communication antenna according to claim 1, wherein the organic light-emitting diode displayer is a TP on cell organic light-emitting diode displayer, the display screen of the TP on cell organic light-emitting diode displayer comprises a protective element, a touch sensing layer, a first electrode, an organic luminous functional layer, an integrated circuit layer integrated with a second electrode, and a substrate sequentially, an output wire is led out from the second electrode, and the near field communication antenna is led to the output circuit of the display screen for the organic light-emitting diode displayer through conductive material.

3. The organic light-emitting diode displayer integrated with a near field communication antenna according to claim 2, wherein, the near field communication antenna is disposed between the protective element and the touch sensing layer, with an insulation protection layer provided to insulate the near field communication antenna from the touch sensing layer at desirable insulation places, and the near field communication antenna is located in a light blocking area at circumference of the touch sensing layer.

4. The organic light-emitting diode displayer integrated with a near field communication antenna according to claim 2, wherein, the near field communication antenna is disposed at circumference of an outer surface of the protective element and covers an insulation protection film.

5. The organic light-emitting diode displayer integrated with a near field communication antenna according to claim 1, wherein the organic light-emitting diode displayer is a TP on cell organic light-emitting diode displayer, the display screen of the TP on cell organic light-emitting diode displayer comprises a protective element, a first electrode, an organic luminous functional layer, an integrated circuit layer integrated with a second electrode, a touch sensing layer and a substrate sequentially, an output wire is led out from the second electrode, the near field communication antenna is led to the output circuit of the display screen for the organic light-emitting diode displayer through conductive material.

6. The organic light-emitting diode displayer integrated with a near field communication antenna according to claim 5, wherein the near field communication antenna is disposed between the substrate and the touch sensing layer and is located in a light blocking area at circumference of the touch sensing layer, or the near field communication antenna is disposed on an outer surface of the substrate in the light blocking area at circumference of the touch sensing layer and covers an insulating protection layer.

7. The organic light-emitting diode displayer integrated with a near field communication antenna according to claim 1, wherein the organic light-emitting diode displayer is a TP in cell organic light-emitting diode displayer, the display screen of the TP in cell organic light-emitting diode displayer comprises a protective element, a first electrode, an organic luminous functional layer, an integrated circuit layer in which a touch sensing layer and a second electrode are integrated, and a substrate sequentially, an output wire is led out from the second electrode, and the near field communication antenna is led to the output circuit of the display screen for the organic light-emitting diode displayer through conductive material.

8. The organic light-emitting diode displayer integrated with a near field communication antenna according to claim 7, wherein the near field communication antenna is disposed between the substrate and the integrated circuit layer in which the touch sensing layer and the second electrode are integrated, or the near field communication antenna is disposed at circumference of an outer surface of the substrate and covers an insulation protection film.

9. The organic light-emitting diode displayer integrated with a near field communication antenna according to claim 1, wherein the near field communication antenna is in a form of a multi-turn coil made from conductive material wiring, the multi-turn coil is led to the output circuit of the display screen for the organic light-emitting diode displayer by conductive material.

10. The organic light-emitting diode displayer integrated with a near field communication antenna according to claim 9, wherein, the multi-turn coil is wound in an annular shape matching with a product outer contour.

11. The organic light-emitting diode displayer integrated with a near field communication antenna according to claim 9, wherein a side of the multi-turn coil, which is closer to an inner part of the organic light-emitting diode displayer, is covered by a layer of transparent ferrite material.

12. The organic light-emitting diode displayer integrated with a near field communication antenna according to claim 9, wherein the multi-turn coil is wound in a rectangle or circle shape.

13. The organic light-emitting diode displayer integrated with a near field communication antenna according to claim 9, wherein the near field communication antenna is made from low-resistance wiring comprising silver, copper or aluminum.

14. The organic light-emitting diode displayer integrated with a near field communication antenna according to claim 10, wherein a side of the multi-turn coil, which is closer to an inner part of the organic light-emitting diode displayer, is covered by a layer of transparent ferrite material.

15. The organic light-emitting diode displayer integrated with a near field communication antenna according to claim 10, wherein the multi-turn coil is wound in a rectangle or circle shape.

16. The organic light-emitting diode displayer integrated with a near field communication antenna according to claim 10, wherein the near field communication antenna is made from low-resistance wiring comprising silver, copper or aluminum.

* * * * *